United States Patent [19]
Trent et al.

[11] Patent Number: 5,185,635
[45] Date of Patent: Feb. 9, 1993

[54] METHOD OF CALIBRATING AND CONTROLLING THE OPTICAL POWER OUTPUT OF AN OTDR

[75] Inventors: William A. Trent; Kevin B. McDonald; Florian G. Bell, all of Bend, Oreg.

[73] Assignee: Tektronix, Inc., Wilsonville, Oreg.

[21] Appl. No.: 737,112

[22] Filed: Jul. 29, 1991

Related U.S. Application Data

[62] Division of Ser. No. 514,792, Apr. 25, 1990, abandoned.

[51] Int. Cl.[5] .......................... G01N 21/88; H01S 3/13
[52] U.S. Cl. ........................................ 356/73.1; 372/32
[58] Field of Search ................ 356/73.1, 326; 250/226; 372/32

[56] References Cited

U.S. PATENT DOCUMENTS

| | | | |
|---|---|---|---|
| 4,099,134 | 7/1978 | Schröder | 330/51 |
| 4,181,961 | 1/1980 | Nopper | 364/563 |
| 4,289,398 | 9/1981 | Robichaud | 356/73.1 |
| 4,303,984 | 12/1981 | Houvig | 364/571 |
| 4,335,384 | 6/1982 | Roos | 343/114 |
| 4,418,392 | 11/1983 | Hata | 364/571 |
| 4,462,082 | 7/1984 | Thiele et al. | 364/571 |
| 4,494,212 | 1/1985 | Muellner | 364/371 |
| 4,510,454 | 4/1985 | Sherman | 330/2 |
| 4,611,304 | 9/1986 | Butenko et al. | 364/571 |
| 4,700,064 | 10/1987 | Fujita | 250/226 X |
| 4,785,419 | 11/1988 | Huffman | 364/571.01 |
| 4,802,107 | 1/1989 | Yamamoto et al. | 364/525 |
| 4,829,533 | 5/1989 | Hallberg et al. | 356/326 X |

OTHER PUBLICATIONS

C. Hui et al., "Backscatter Signature Generator for OTDR Calibration", SPIE vol. 1180 *Tests, Measurements, and Characterization of Electro-Optic Devices and Systems* (1989) pp. 27–34.

Metrology Technical Report 88-01, Dept. of Nay Technical Report, pp. 90–94.

*Primary Examiner*—Vincent P. McGraw
*Attorney, Agent, or Firm*—William K. Bucher

[57] ABSTRACT

An input signal is sampled by alternately coupling the input signal and a reference level to a sample storage element, whereby the magnitude of the signal stored by the storage element immediately following application of the input signal to the storage element is a function of the input signal magnitude and the magnitude of the signal stored by the storage element immediately preceding coupling of the input signal to the storage element is a function of the reference level.

3 Claims, 4 Drawing Sheets

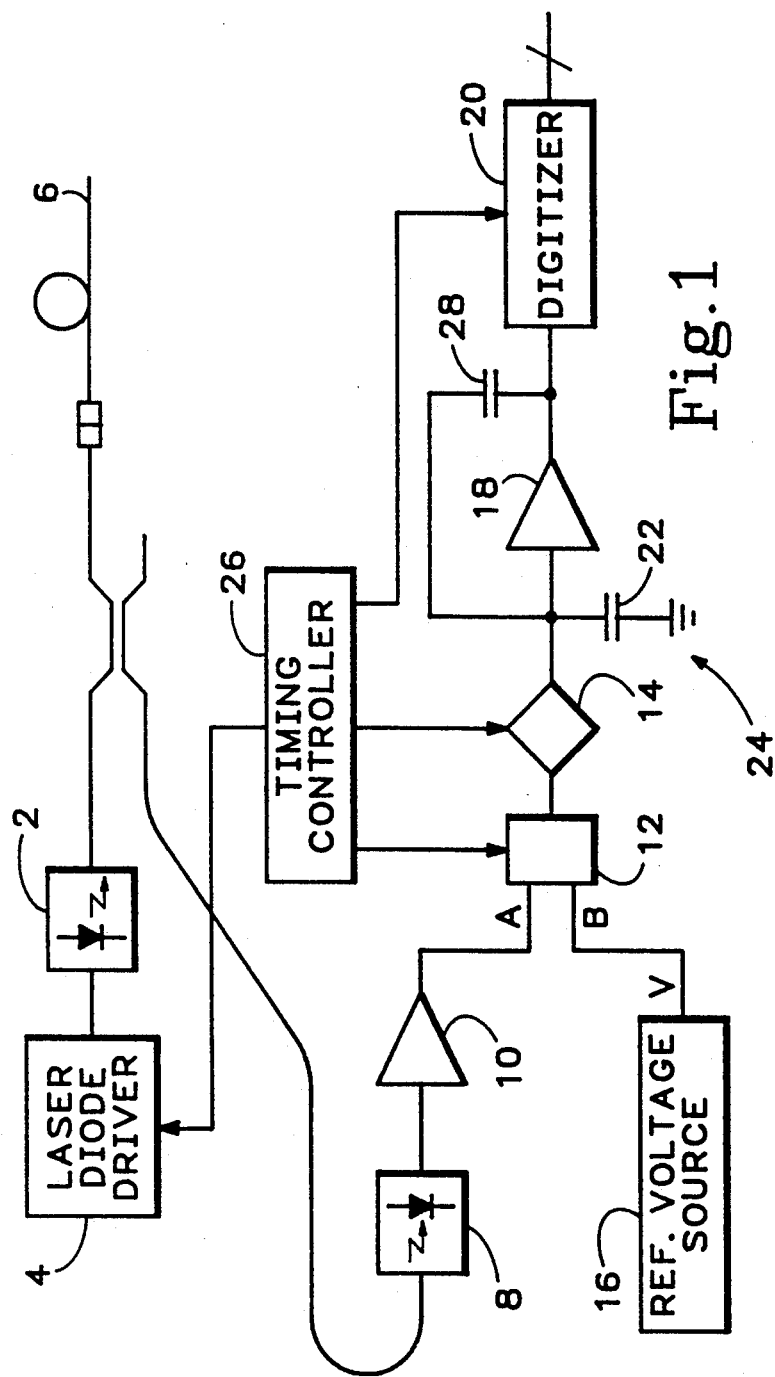

METHOD OF CALIBRATING AND CONTROLLING THE OPTICAL POWER OUTPUT OF AN OTDR

This is a division of application Ser. No. 07/514,792 filed Apr. 25, 1990, now abandoned.

BACKGROUND OF THE INVENTION

This invention relates to a method of operating a measurement instrument.

In an optical time domain reflectometer (OTDR) a laser diode is periodically energized to launch light pulses into a fiber under test. Rayleigh backscattered light and Fresnel reflected light received from the fiber under test are applied to a photodetector. The photodetector provides a current that depends on the intensity of return light incident on the photodetector. This current signal is applied to a transimpedance amplifier, which converts the current signal to a voltage signal and amplifies it. The amplified voltage signal is sampled at predetermined times relative to the times of energization of the laser diode, and the sample values are measured using an analog-to-digital converter (ADC). The digital data values provided by the ADC are processed and are stored at memory locations that depend on the interval between launch of the interrogation pulse into the fiber under test and sampling of the output signal of the transimpedance amplifier. The stored sample values can be used to provide a display showing intensity of return light received from the optical fiber, expressed as attenuation of emitted light, as a function of distance from the laser diode.

The voltage signal is generally sampled using a sampling gate and a sample storage capacitor. The sampling gate is opened (rendered conductive) for a brief sampling interval to allow the storage capacitor to charge, and is then closed (rendered nonconductive). The voltage stored on the capacitor is measured by converting it to digital form under control of a conversion pulse that occurs in timed relationship to the operation of the sampling gate.

The return optical signal received from the fiber under test is composed of a low level backscatter signal and occasional brief pulses of very high magnitude due to reflections. Consequently, the return optical signal has a very large dynamic range. The dynamic range of the electrical signal that is sampled can be reduced relative to that of the return optical signal by designing the transimpedance amplifier so that it has a linear transfer function for small signal levels and a logarithmic transfer function for large signal levels. However, even then the dynamic range of the signal that is applied to the sampling system is substantial. Further, the complex nature of the overall transfer function of the transimpedance amplifier results in calibration being difficult and somewhat limited in accuracy.

The sampling efficiency of a sampling system is a measure of the relationship between the sample value provided at the output of the sampling system and the value of the input signal during the sampling interval. There are two aspects to the sampling efficiency of a sampling system that comprises a sampling gate and a storage capacitor, namely transfer efficiency and charging efficiency. Transfer efficiency of the sampling gate is a measure of the relationship between the voltage at the input of the sampling gate and the voltage at the output of the sampling gate during the sampling interval. Charging efficiency is a measure of the relationship between the voltage at the output of the sampling gate during the sampling interval and the voltage that exists on the storage capacitor when the sampling gate has closed at the end of the sampling interval. The transfer efficiency may be less than 100%, due to impedance in the arms of the sampling gate establishing a potential divider. A transfer efficiency less than 100% can be compensated by including a suitable gain stage downstream of the storage capacitor. The charging efficiency depends on the duration of the sampling interval. The duration of the sampling interval is limited by the bandwidth of the input signal, since the duration of the sampling interval is inversely related to the frequency of the input signal. The charging efficiency can also depend on the amplitude of the input signal, since the rate at which charge can be supplied to the capacitor through the sampling gate may be limited. Further, the charging efficiency can depend on the direction of the flow of current through the sampling gate. Moreover, if the amplitude of the input signal changes by a large amount between one sampling interval and the next, as in the case in an OTDR when consecutive samples represent a reflection event and backscattering, the measured value of the second sample can depend on the value of the first sample and therefore the sampling system is signal dependent.

The intensity of backscattered light received by an OTDR from a fiber under test is a function of the wavelength and intensity of the interrogation pulse. The intensity of the optical output provided by a laser diode is an approximately Gaussian function of wavelength and has a half-amplitude width of only a few nanometers. The center wavelength is quite strongly dependent on temperature. Therefore, to obtain measurement repeatability in an OTDR it is necessary to maintain the laser diode at a constant temperature. This can be accomplished using a thermoelectric cooler that operates in a feedback loop with a temperature sensor. The operating temperature of the laser diode is established by a temperature level signal provided by the OTDR's internal controller. However, this does not guarantee measurement repeatability from instrument to instrument.

SUMMARY OF THE INVENTION

In accordance with a first aspect of the invention, a method of sampling an input signal comprises repeatedly coupling the input signal to a sample storage element, whereby the magnitude of the signal stored by the storage element immediately following application of the input signal to the storage element is a function of the input signal magnitude, and coupling a reference level to the sample storage element between consecutive couplings of the input signal to the storage element, whereby the magnitude of the signal stored by the storage element immediately preceding coupling of the input signal to the storage element is a function of the reference level.

In accordance with a second aspect of the invention, sampling apparatus comprises a sample storage element, means for coupling an input signal to the storage element, whereby the magnitude of the value stored by the storage element immediately following application of the input signal to the storage element is a function of the signal magnitude, and means for coupling a reference level to the storage element immediately before coupling the input signal to the storage element, whereby the magnitude of the value stored by the storage element immediately before coupling of the input signal to the storage element is a function of the reference level.

In accordance with a third aspect of the invention, apparatus for sampling an input signal, comprises a sample storage element, a source of a reference level, and means for selectively coupling either the input signal or the reference level to the sample storage element, whereby the value stored by the storage element immediately before coupling of the input signal to the storage element is a function of the reference level and the value stored by the storage element immediately following coupling of the input signal to the storage element is a function of the input signal magnitude.

In accordance with a fourth aspect of the invention, a method of operating a test instrument having a laser diode and a device for controlling the temperature of the laser diode in dependence upon a temperature control signal comprises operating the laser diode, observing the wavelength distribution of the optical power emitted by the laser diode, comparing the center wavelength of the wavelength distribution with a desired value, and adjusting the temperature control signal in response to the result of the comparison.

In accordance with a fifth aspect of the invention, a method of operating a measurement instrument that comprises signal acquisition apparatus for proving a raw data value representative of a measured value of a measurable condition of a system under test, comprises acquiring a plurality of raw data values representative of a plurality of measured values of said condition, generating a plurality of calibrated data values representative of calibrated values of said condition, examining the raw data values and the calibrated data values and generating data representing a predetermined relationship between the raw data values and corrected data values that are at least approximately equal to the calibrated data values, storing the data representing the predetermined relationship, subsequently employing the data representing the predetermined relationship to generate a correction table that returns corrected data values in response to raw data values, and applying raw data values to the correction table.

In accordance with a sixth aspect of the invention, a measurement instrument comprises signal acquisition apparatus for providing raw data values representative of the measured value of a measurable condition of a system under test, a calibration memory that contains data representing a predetermined relationship between raw data values and corrected data values that are at least approximately equal to calibrated values of said condition, a correction memory connected to receive the raw data values as input, and means for loading the correction memory with a table that returns corrected data values in response to the raw data values.

BRIEF DESCRIPTION OF THE DRAWINGS

For a better understanding of the invention, and to show how the same may be carried into effect, reference will now be made, by way of example, to the accompanying drawings in which:

FIG. 1 shows an interrogation and data acquisition system embodying the present invention in block form, FIG. 2 illustrates the timing of the operation of the system shown in FIG. 1.

In the several figures of the drawings, like reference numerals designate like components, and primed reference numerals designate components having corresponding functions to the components indicated by the corresponding unprimed numerals.

DETAILED DESCRIPTION

Figure 3:
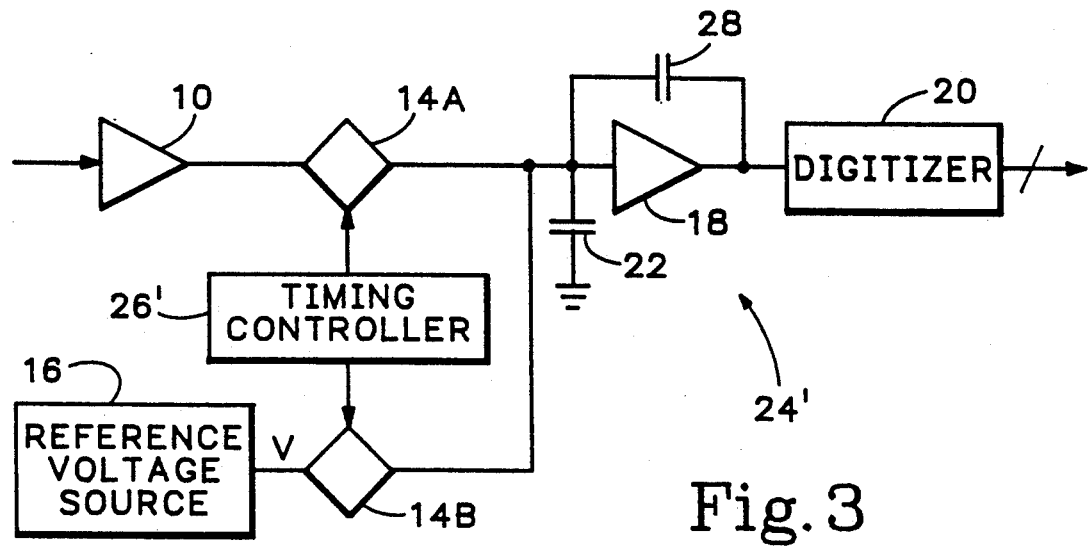
FIG. 3 illustrates part of a second interrogation and data acquisition system embodying the present invention, also in block form.

The interrogation and data acquisition system shown in FIG. 1 is part of an OTDR and comprises a laser diode 2 that is energized intermittently by a laser diode driver 4 to launch interrogation pulses into a fiber under test 6. A portion of the return light received from the fiber under test is applied to a photodetector 8. Photodetector 8 provides a current signal proportional to the intensity of return light incident on the photodetector, and this current signal is converted to a voltage signal and is amplified by a transimpedance amplifier 10. The resulting amplified voltage signal is applied to one input A of an analog multiplexer 12, which has a second input B at which it receives a constant voltage level V from a reference voltage source 16. Multiplexer 12 has an output terminal connected to an analog-to-digital converter (ADC) 24 comprising a sampling gate 14, a storage capacitor 22, an amplifier 18 and a digitizer 20. A timing control circuit 26 controls operation of laser diode driver 4, multiplexer 8, sampling gate 14 and digitizer 20. The purpose of capacitor 28 will be described in connection with FIG. 3.

In operation of the apparatus shown in FIG. 1, timing control circuit 26 applies a pulse to laser diode driver 4 to cause laser diode 2 to launch an interrogation pulse into the fiber under test. During a sampling interval that takes place at a predetermined time relative to launch of the interrogation pulse, timing control circuit 26 applies pulses to multiplexer 8 and sampling gate 14 so that multiplexer 8 connects its output terminal to its input A and sampling gate 14 is opened. In this fashion, storage capacitor 22 is charged to a voltage that depends on the amplitude of the voltage signal provided by amplifier 10. Sampling gate 14 is then closed, and a conversion pulse is applied to digitizer 20 to cause digitizer 20 to measure the voltage stored on capacitor 22 by converting the voltage level to digital form.

As shown in FIG. 2, timing control circuit 26 connects reference voltage source 16 to capacitor 22 before it connects amplifier 10 to capacitor 22. Thus, before the output signal of transimpedance amplifier 10 is sampled, timing control circuit 26 opens sampling gate 14 and places multiplexer 12 in the condition in which its output is connected to its input B, so that capacitor 22 is charged to the reference potential level V. In this fashion, capacitor 22 is reset to a constant reference level prior to taking a signal sample. Therefore, the interrogation and sampling system described with reference to FIG. 1 removes or substantially reduces signal dependence.

A disadvantage of the apparatus shown in FIG. 1 is that a fast and accurate analog multiplexer is required and sampling gate 14 must operate at twice the effective sampling frequency. In a high resolution system, in which the interrogation pulses are very short and the sampling apparatus has a high bandwidth, the sampling interval is very short and the charging efficiency is less than 100%. Even though the reset voltage is constant and therefore the sampling gate could be held open for a relatively long time for sampling the reference potential, it is difficult to provide for different sampling intervals depending on whether multiplexer 12 selects input A or input B.

Figure 4:
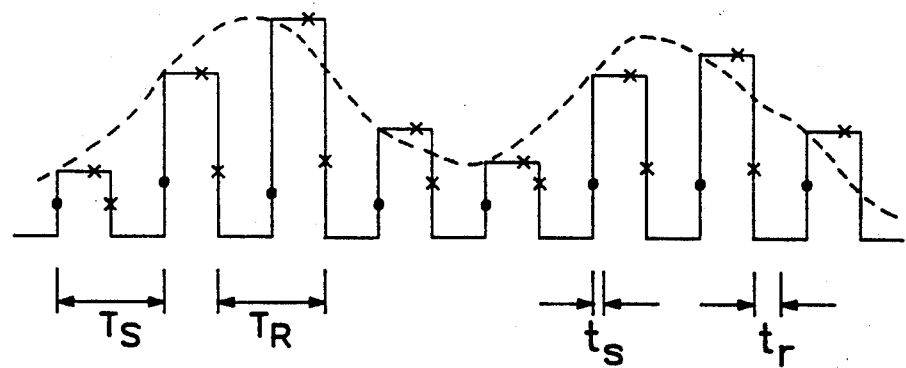
FIG. 4 is a graph illustrating operation of the system shown in FIG. 3.

These disadvantages are avoided in the case of the system shown in FIG. 3, in which two sampling gates 14A and 14B are employed instead of multiplexer 8 and a single sampling gate 14. By use of a separate rest sampling gate, a long sampling interval and 100% charging efficiency can be achieved without compromising the bandwidth of the signal sampling or having to operate a single sampling gate with two different sampling intervals. Each sampling gate operates only at the effective signal sampling frequency. FIG. 4 illustrates operation of the apparatus shown in FIG. 3. In FIG. 4, $T_S$ represents the interval between signal samples, $T_R$ represents the interval between reset samples, $t_S$ represents the signal sample interval and $t_R$ represents the reset sample interval. The asterisks (*) represent analog to digital conversion points. The relative length of the signal sample interval $t_S$ is distorted in FIG. 4, since $t_s$ must be sufficiently short that the signal level remains essentially constant.

If a sampling system having a charging efficiency less than 100% is used to sample a signal that undergoes a step change in potential, the first sample taken after the step change depends on both the potential after the step change and the potential before the step change. The sampling system shown in FIG. 3 alternates between the reset level and the input signal, and therefore every signal sample is effectively the first sample after a step change unless the signal level is equal to the reset level. Capacitor 28 connected across amplifier 18 provides positive feedback to storage capacitor 22. By appropriate selection of capacitor 28, it is possible to achieve 100% charging efficiency. The reset samples then have no effect on the voltage to which capacitor 22 is charged during the signal sample interval.

The maximum current that must be supplied through sampling gate 14A would be minimized by selecting the reset level to be in the middle of the range of signal sample levels. However, the current that must be supplied through sampling gate 14A for low level signals would then be almost the maximum current, leading to possible inaccuracy. Moreover, having the reset level in the middle of the range of signal sample levels would prelude unipolar sampling. In order to achieve unipolar sampling, the reset level V is set outside the range of levels of the signal samples. In a practical implementation of the embodiment shown in FIG. 3, the range of the output signal of amplifier 10 is ±0.7 v and the transfer efficiency of the signal sampling gate 14A is about 60%, and therefore the range of sample levels is ±0.42 v. The transfer efficiency of the reset sampling gate 14B is 100%. The reset level V is set at about −0.5 v so that the storage capacitor is always driven positive when the input signal is sampled. This also minimizes the current that must be provided through the sampling gate 14A for the low level signals of the OTDR in order to charge the storage capacitor and eliminates errors due to limits on the current supplying capacity of sampling gate 14A. This improvement in accuracy of the samples of the low level signals is at the expense of loss of accuracy in the high level samples, since the maximum change in potential of the capacitor is about 0.9 v instead of 0.42 v, but accuracy of the high level samples is less critical and, in any event, can be compensated by use of the arrangement shown in FIG. 5.

Figure 5:
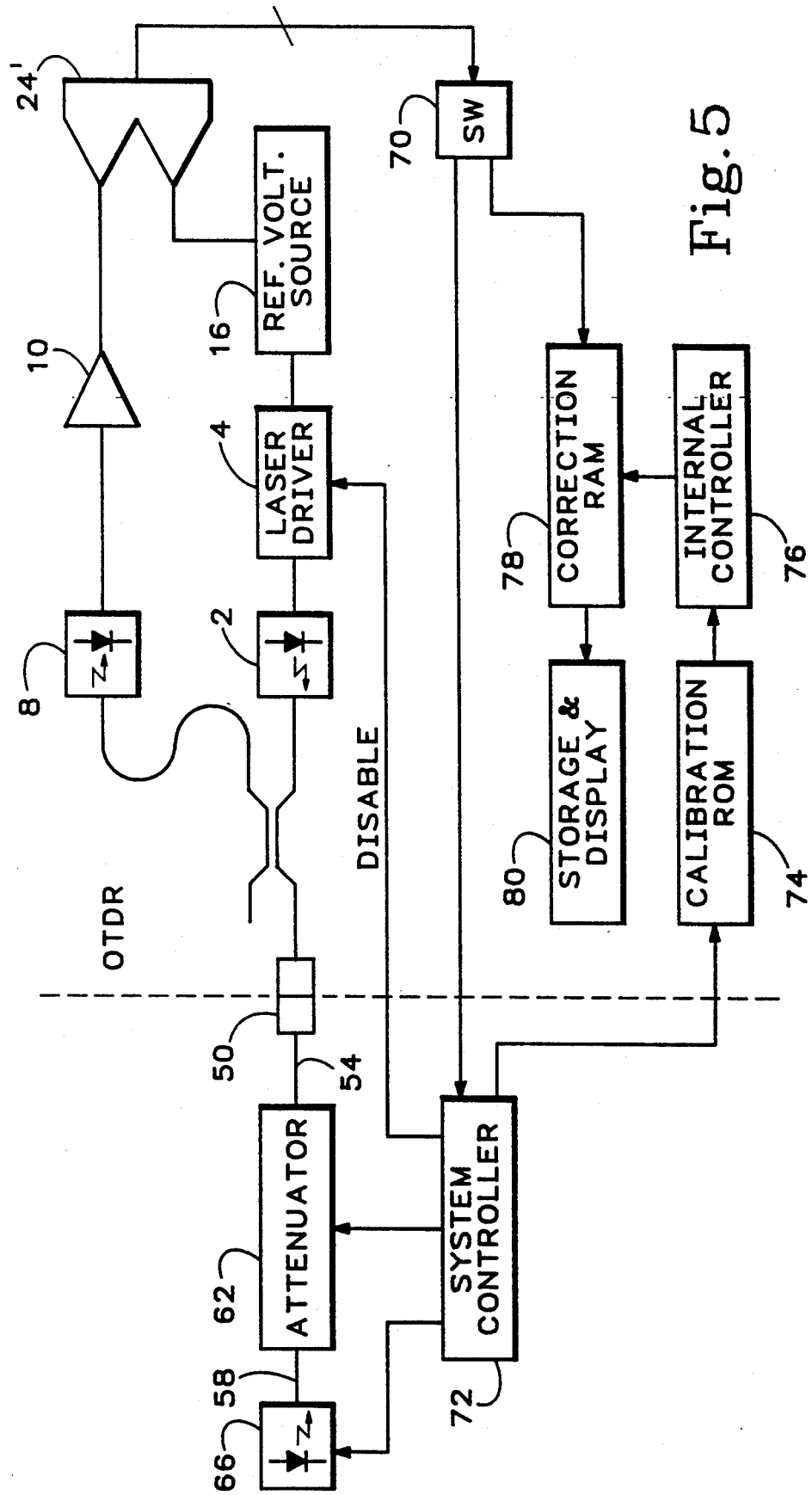
FIG. 5 is a block diagram of apparatus for calibrating an OTDR.

FIG. 5 illustrates how the OTDR can be calibrated in a manner that allows compensation for loss of accuracy in measurement of the high level samples.

As shown in FIG. 5, the front panel connector 50 of the OTDR is connected through optical fibers 54, 58 and a programmable optical attenuator 62 to an external laser source 66, which includes a laser diode that produces light pulses of a known center wavelength and intensity. Laser source 66 has previously been used to characterize the attenuator in a precalibration operation, so that the wavelength dependence and nonlinearity of the attenuator are compensated. A programmable system controller 72 is connected to the OTDR, the attenuator and the laser source. Controller 72 might be, for example, a personal computer that has a GPIB card that allows it to communicate with the OTDR and laser source 66 and attenuator 62. The system controller disables the laser diode driver of the OTDR, and receives the digital output values from ADC 24' by way of a switch 70. Controller 72 adjusts the attenuator to a selected attenuation level, e.g. 0 dB, stores this value, and triggers the external laser source to emit pulses, which are detected by photodetector 8. The controller 72 stores the data value provided by ADC 24' and repeats these operations for multiple attenuation levels in a predetermined range. For example, the operation might be repeated over a 100 dB range in steps of 1 dB. A desired transfer function relating attenuation to calibrated data values is defined and is stored by controller 72. The desired transfer function might be logarithmic for a range from 0 to 50 dB attenuation and linear for a range from 50 to 100 dB attenuation. By repeating the measurement operation for each attenuation level at which the data value provided by ADC 24' is stored, a raw data value corresponding to each calibrated data value can be acquired.

If the transfer function of the receiver was the same as the desired transfer function, the raw data values for a given attenuator level would be equal to the corresponding calibrated data value. However, in general the two transfer functions are not equal.

Figure 6:
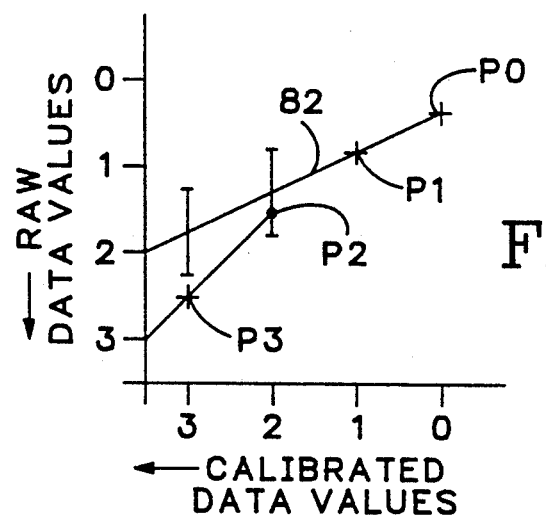
FIG. 6 is a graph useful in explaining operation of the apparatus shown in FIG. 5.

The raw and calibrated data values may be depicted graphically as data points in a two-dimensional cartesian coordinate system, as shown by crosses P in FIG. 6. For the sake of simplifying the following discussion, the calibrated data values are indicated as having a minimum increment corresponding to a 1 dB increase in attenuation. However, in practice the calibrated data values are 16-bit numbers and therefore the minimum increment corresponds to an increase in attenuation that is much less than 1 dB. Similarly, the minimum increment of the raw data values corresponds to a change in attenuation that is much less than 1 dB, and accordingly in FIG. 6 the raw data is shown as having noninteger values. Starting at one end of the range of data values, e.g. at the end corresponding to 0 dB attenuation, the controller 72 examines the pairs of data values and defines a piecewise linear approximation of the function that relates the calibrated data values to the raw data values. Referring to FIG. 6, the controller examines the first two data points P0, P1 (for 0 and 1 dB attenuation respectively) and calculates the linear function that relates the data points. The linear function is represented in FIG. 6 by the line 82. The controller examines the raw datum value corresponding to a setting of 1 dB, or point P1. The difference between the expected datum value based on the linear function, and the raw datum value is the calibration value for that point. The controller then advances to the next data pair corresponding to the point P2. The calibration value is determined from the difference between the expected datum value based on the linear function and the raw datum value for point P2. The controller then calculates the difference between the calibration value for point P1 and the calibration value for the point P2. If this difference is greater than a preset threshold, typically 1 dB, the region between P1 and P2 will be further calibrated. In this operation, the region between P1 and P2 will be divided into two parts and a calibration will be performed at a point midway between P1 and P2. This threshold test will be continued until the difference between any two adjacent calibration values within the region between P1 and P2 is less than the preset threshold. The controller continues to calculate calibration values for all measured data points. It also divides the range between adjacent points into more segments until the difference between adjacent data values over the entire calibration range is less than the preset threshold. The set of calibration data will then consist of segments of data whose two end points each correspond to a pair of data representing an attenuation setting and a calibration value for the raw datum. The calibration value for any intermediate raw datum value within a segment is obtained from a piecewise linear function relating the raw data values to the calibrated values for the segment end points. For each segment of the piecewise linear function, the controller loads the calibrated data values for the beginning of the segment, the increment size, or change in calibrated data value per unit change in raw data value, and the number of units in the interval of the raw data range corresponding to that segment, into a calibration ROM 74.

For the linear portion of the range of the desired transfer function, i.e. the range from 50 to 100 dB attenuation, controller 72 examines every other point over the top 10 dB interval of the range and calculates a linear function that fits those data points closely. The controller loads the calibrated data values for the beginning of the linear portion of the range, the calibrated data increment size and the size of the raw data range into the calibration ROM.

A typical OTDR has at least two laser diodes, allowing operation at 830 nm and 1300 nm, and has several other operating conditions that affect the relationship between the intensity of return light and attenuation suffered by the light being propagated through the fiber under test. The calibration procedure is repeated for each other combination of operating conditions, and the corresponding sets of calibration data are loaded into ROM 74.

When the calibration is completed, switch 70 is set to connect the digital output of ADC 24' to the address lines of a correction RAM 78. The data lines of RAM 78 are connected to storage and display components 80 of the OTDR. In the measurement mode, the front panel controls of the OTDR are adjusted to a given combination of operating conditions. The instrument's internal controller 76 reads the corresponding calibration data from the calibration ROM and generates a correction table, which it loads into a correction RAM 78. The correction table is generated by calculating a correction data value for each raw data value within the range of the raw data values provided by ADC 24' by starting with the calibrated data value for the beginning of an interval of the range and incrementing that starting value by the increment size for each unit in the raw data range. The corrected data values are loaded into correction RAM 78 at the locations that have as their addresses the corresponding raw data values. Therefore in response to a given raw data value, RAM 78 provides a corrected data value that is the same as the calibrated data value, within the accuracy of the procedure used to derive the calibration data. By generating a piecewise linear function that approximates the calibration function and storing calibration data that define the piecewise linear function, and then using the calibration data to generate the lookup table, the need to calculate a corrected data value in response to each raw data value provided by the ADC is avoided. This allows multiple large calibration tables to be provided without need to store all the data points.

By use of the calibration method described with reference to FIGS. 5 and 6, errors in the accuracy of samples acquired using the systems shown in FIGS. 1 and 3 can be compensated.

Figure 7:
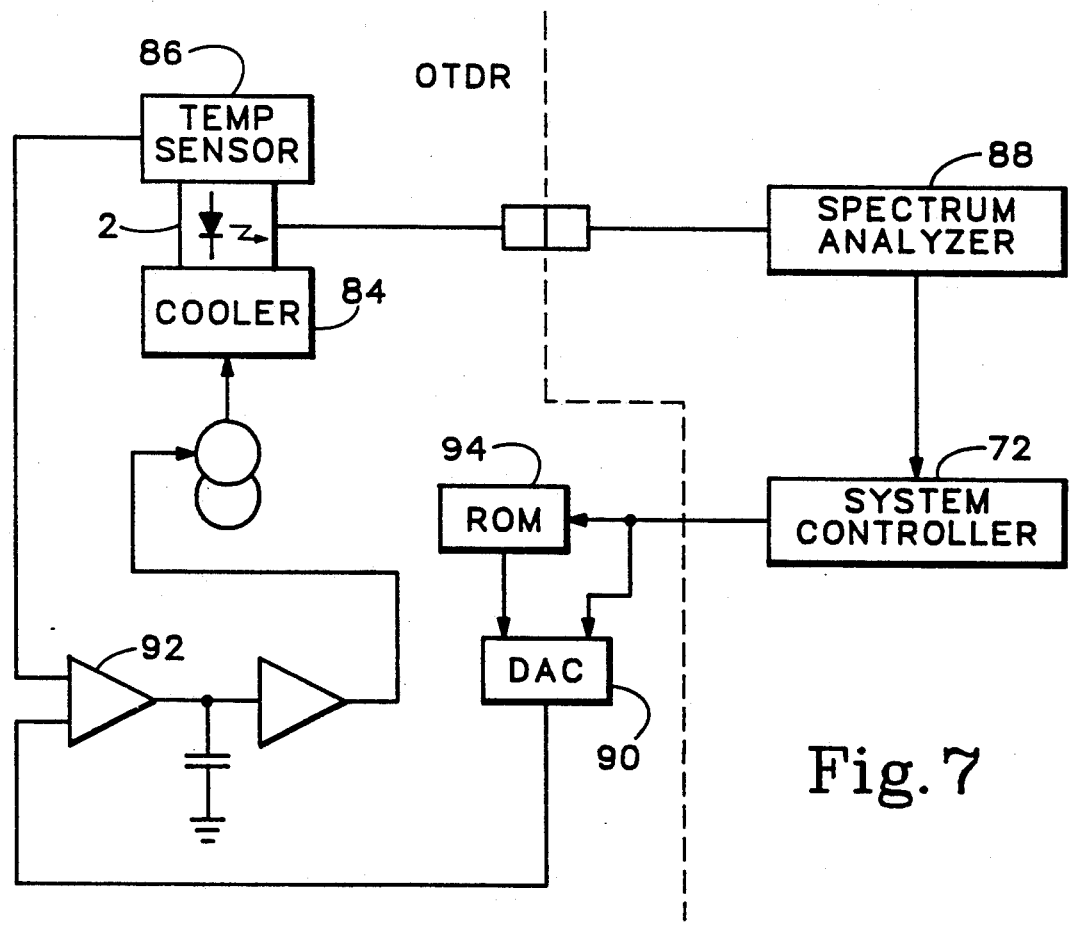
FIG. 7 is a block diagram of apparatus for establishing the operating temperature of the laser diode of an OTDR.

The OTDR shown in FIG. 7 includes a thermoelectric cooler 84 and a temperature sensor 86, both in good thermally conductive contact with laser diode 2. The temperature sensor provides a measured value signal that is representative of the temperature of laser diode 2. The front panel connector of the OTDR is connected to an optical spectrum analyzer 88, which provides data values representing the optical power that it receives as a function of wavelength. These data values are provided to the system controller 72, which is connected to the laser driver (not shown in FIG. 7). The system controller triggers the laser driver continuously, so that the laser diode provides a rapid sequence of light pulses. The optical spectrum analyzer measures the wavelength distribution of the optical power received from the laser diode. The system controller compares the center wavelength of the optical power emitted by the laser diode with a desired wavelength and if the center wavelength differs from the desired wavelength beyond a predetermined tolerance, the system controller generates a digital desired temperature signal, which it provides to the OTDR. In the OTDR, the desired temperature signal is converted to analog form by a digital-to-analog converter (DAC) 90. A comparator 92 compares the measured value signal provided by sensor 86 with the desired value signal received from DAC 90 and supplies current to the thermoelectric cooler such as to maintain equality between the two signals and thereby hold the laser diode 2 at the temperature at which the center wavelength is equal to the desired wavelength. Controller 72 loads the desired temperature signal into ROM 94. In normal operation of the OTDR the digital value stored in ROM 94 is converted to analog form by DAC 90 and is used to control operation of cooler 84 so as to maintain diode 2 at the temperature at which the center wavelength is equal to the desired wavelength.

In some cases, the range of temperatures that can be achieved by thermoelectric cooler 84 might be insufficient to bring the center wavelength of laser diode 2 to the desired value. In this case, the temperature control data value is selected to bring the center wavelength of laser diode 2 as close as possible to the desired value and the remaining error value is provided to the OTDR's internal controller. The internal controller uses this error value in conjunction with the known function that relates backscattered power to wavelength to compensate for the error in the linear range of the transfer function.

It will be appreciated that the invention is not restricted to the particular embodiments that have been described and illustrated and that variations may be made therein without departing from the scope of the invention as defined in the appended claims and equivalents thereof.

We claim:

1. A method of calibrating and controlling the optical power output of a laser diode in an optical time domain reflectometer to establish and maintain a desired center wavelength as a function of controlling the operating temperature of the laser diode comprising the steps of:

generating a measured value signal having a magnitude value that is a direct measurement of the operating temperature of the laser diode;

generating an optical power output from the laser diode;

measuring the wavelength distribution of the optical power output from the laser diode for determining the center wavelength of the optical power output;

comparing the center wavelength of the optical power output with a desired center wavelength for the laser diode for generating a desired temperature signal having a magnitude value that is a function of the difference between the measured center wavelength and the desired center wavelength of the optical power output of the laser diode; and comparing the measured value signal with the desired temperature signal for generating a supply current to a thermoelectric cooler coupled to the laser diode for controlling the operating temperature of the laser diode to establish the laser diode at the temperature at which the center wavelength is equal to the desired center wavelength.

2. The method of calibrating and controlling the optical power output of a laser diode in an optical time domain reflectometer as recited in claim 1 wherein the desired temperature signal is a digital value, the third generating step further comprising the step of converting the digital desired temperature signal into an analog signal.

3. The method of calibrating and controlling the optical power output of a laser diode in an optical time domain reflectometer as recited in claim 2 wherein the control of the optical power output of the laser diode further comprising the steps of:

storing the digital desired temperature signal in the optical time domain reflectometer;

reading out the digital desired temperature signal value and converting it to and analog value;

comparing the analog value of the stored digital desired temperature signal with the measured temperature signal to control the operation of the thermoelectric cooler to maintain the laser diode at the temperature at which the center wavelength is equal to the desired wavelength.

* * * * *